United States Patent [19]
Uchida

[11] Patent Number: 5,598,363
[45] Date of Patent: Jan. 28, 1997

[54] SEMICONDUCTOR DEVICE HAVING AN IMPROVED RELIABILITY

[75] Inventor: Toshiya Uchida, Kawasaki, Japan

[73] Assignee: Fujitsu Limited, Kawasaki, Japan

[21] Appl. No.: 590,362

[22] Filed: Jan. 25, 1996

[30] Foreign Application Priority Data

Jun. 16, 1995 [JP] Japan .................................. 7-150033

[51] Int. Cl.[6] .................................................. H01L 27/10
[52] U.S. Cl. .............................. 365/63; 365/51; 365/226; 257/207
[58] Field of Search ............................... 365/51, 63, 226; 257/206, 207, 208

[56] References Cited

U.S. PATENT DOCUMENTS

5,040,144  8/1991  Pelley et al. ............................... 365/51
5,260,892  11/1993  Testa ........................................ 365/63
5,293,559  3/1994  Kim et al. ................................. 365/63

Primary Examiner—Son T. Dinh
Attorney, Agent, or Firm—Armstrong, Westerman, Hattori, McLeland & Naughton

[57] ABSTRACT

A semiconductor device includes a plurality of signal lines, a plurality of first power lines for supplying electric power at a first voltage level, and a plurality of second power lines for supplying electric power at a second voltage level, wherein the signal lines, first power lines and the second power lines are disposed such that a signal line is laterally bounded by a first power line at a first side thereof and by another first power line at the other side thereof, a signal line different from the signal line that is bounded laterally by the first power lines, is laterally bounded by a second power line at a first side thereof and by another second power line at the other side thereof.

8 Claims, 11 Drawing Sheets

SEMICONDUCTOR DEVICE HAVING AN IMPROVED RELIABILITY

BACKGROUND OF THE INVENTION

The present invention generally relates to semiconductor devices and more particularly to a semiconductor memory device such as a dynamic random access memory in which power conductor patterns are provided for selectively activating sense amplifiers that are provided in a memory cell array in correspondence to memory cell columns.

In large capacity semiconductor memories such as DRAMs that have a very large storage capacity of information, a very large number of memory cells are activated in response to single row address data or RAS access. In such large capacity memories, therefore, a very large number of bit lines are charged or discharged in response to a single RAS access, and the delay associated with such charging and discharging of the bit lines has become a major factor that impedes high speed operation of the memory device.

In order to attend to this problem, various proposals are made so far. For example, one may reduce the number of the memory cells that are activated by a single row address, by dividing a memory cell block into a plurality of sub-blocks. However, such an approach invites an increase in the chip size and hence the cost of the device.

Another approach to this problem is to provide a large driving power to sense amplifiers that cause charging and discharging of the bit lines. In relation to this, there arises a demand for minimizing the resistance of power conductor patterns that are used for feeding drive current to the respective sense amplifiers.

In order to meet the demand of reduced resistance of the power conductor patterns, recent semiconductor memory devices use a layout in which each of the sense amplifiers that are driven by a driver circuit is disposed in the vicinity of the driver circuit. Conversely, the driver circuits are disposed in the vicinity of the sense amplifiers that cooperate therewith. By constructing the semiconductor memory device as such, it becomes possible to reduce the length and hence the resistance of the power conductor pattern.

In such conventional DRAMs, a power conductor pattern inevitably extends parallel with a signal conductor pattern used for conducting a selection of sense amplifiers, and the power conductor patterns and the signal conductor patterns are formed to extend parallel with each other on the same wiring layer covering the memory cell array. It will be understood that such a construction is vulnerable to dusts that may cause a short circuit between the power conductor pattern and the adjacent signal conductor pattern.

Figure 1:
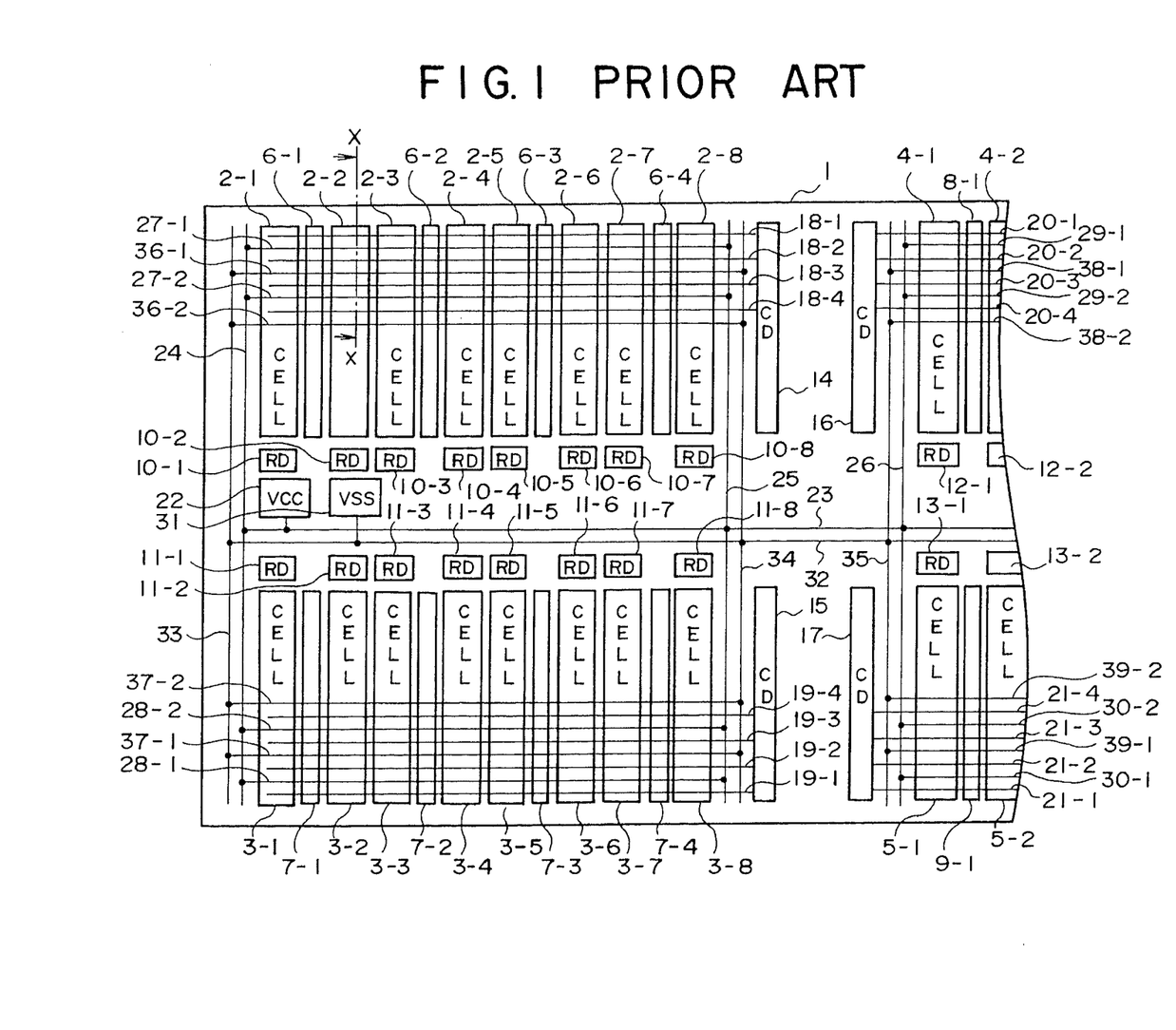
FIG. 1 is a diagram showing the layout of a conventional DRAM.

FIG. 1 shows the construction of a conventional DRAM in which drivers of the sense amplifiers are distributed in the memory cell array for reducing the length of the power conductor patterns leading therefrom to the sense amplifiers.

Referring to FIG. 1, the DRAM is formed on a chip 1 in which memory cell blocks $2_{-1}$–$2_{-8}$, $3_{-1}$–$3_{-8}$, $4_{-1}$, $4_{-2}$, $5_{-1}$, $5_{-2}$, . . . are provided, wherein each of the memory cell blocks $2_{-1}$–$2_{-8}$, $3_{-1}$–$3_{-8}$, $4_{-1}$, $4_{-2}$, $5_{-1}$, $5_{-2}$, . . . includes an array of memory cells in which memory cells are arranged in rows and columns. Further, the chip 1 carries thereon a plurality of sense amplifier blocks $6_{-1}$–$6_{-4}$, $7_{-1}$–$7_{-4}$, $8_{-1}$, $9_{-1}$ . . . , wherein each of the sense amplifier blocks includes a number of sense amplifiers arranged in a row, together with a driver circuit. By selecting one of the sense amplifiers in a sense amplifier block, a group of memory cells aligned in a column are selected in the corresponding memory cell block.

Further, the chip 1 carries thereon row decoders $10_{-1}$–$10_{-8}$, $11_{-1}$–$11_{-8}$, $12_{-1}$, $12_{-2}$, $13_{-1}$, $13_{-2}$, . . . , wherein the row decoders decode row address data supplied thereto and select a word line corresponding to the supplied address data as usual in DRAMs. Similarly, the chip 1 carries thereon column decoders 14–17 wherein the column decoders decode column address data supplied thereto and produce a column selection signal in response thereto for selecting a sense amplifier that is provided in each column.

In relation to the selection of the sense amplifiers, the chip 1 carries thereon signal conductor patterns $18_{-1}$–$18_{-4}$, $19_{-1}$–$19_{-4}$, $20_{-1}$–$20_{-4}$, and $21_{-1}$–$21_{-4}$ for carrying column selection signals, such that the signal conductor patterns extend from the column decoders 14–17 to the corresponding sense amplifiers for supplying the column selection signals thereto. Further, the chip 1 carries thereon an electrode pad 22 for a Vcc voltage, wherein the Vcc voltage is distributed from the pad 22 to various parts of the semiconductor integrated circuit on the chip 1 by way of power conductor patterns 23–26 as well as power conductor patterns $27_{-7}$, $27_{-2}$, $28_{-1}$, $28_{-2}$, $29_{-1}$, $29_{-2}$, $30_{-1}$, $30_{-2}$. It should be noted that the power conductor patterns $27_{-1}$, $27_{-2}$, $28_{-1}$, $28_{-2}$, $29_{-1}$, $29_{-2}$, $30_{-1}$ and $30_{-2}$ are used explicitly for supplying the Vcc voltage to driver circuits of the sense amplifiers.

Similarly to the Vcc pad 22, the chip 1 carries thereon an electrode pad 31 for a Vss voltage, wherein the Vcc voltage is distributed from the pad 31 to various parts of the semiconductor integrated circuit on the chip 1 by way of power conductor patterns 32–35 as well as by way of power conductor patterns $36_{-1}$, $36_{-2}$, $37_{-1}$, $37_{-2}$, $38_{-1}$, $38_{-2}$, $39_{-1}$ and $39_{-2}$, wherein the power conductor patterns $36_{-1}$, $36_{-2}$, $37_{-1}$, $37_{-2}$, $38_{-1}$, $38_{-2}$, $39_{-1}$ and $39_{-2}$ are used explicitly for supplying the Vss voltage to the driver circuits of the sense amplifiers, in addition to the Vcc voltage mentioned previously.

Figure 2:
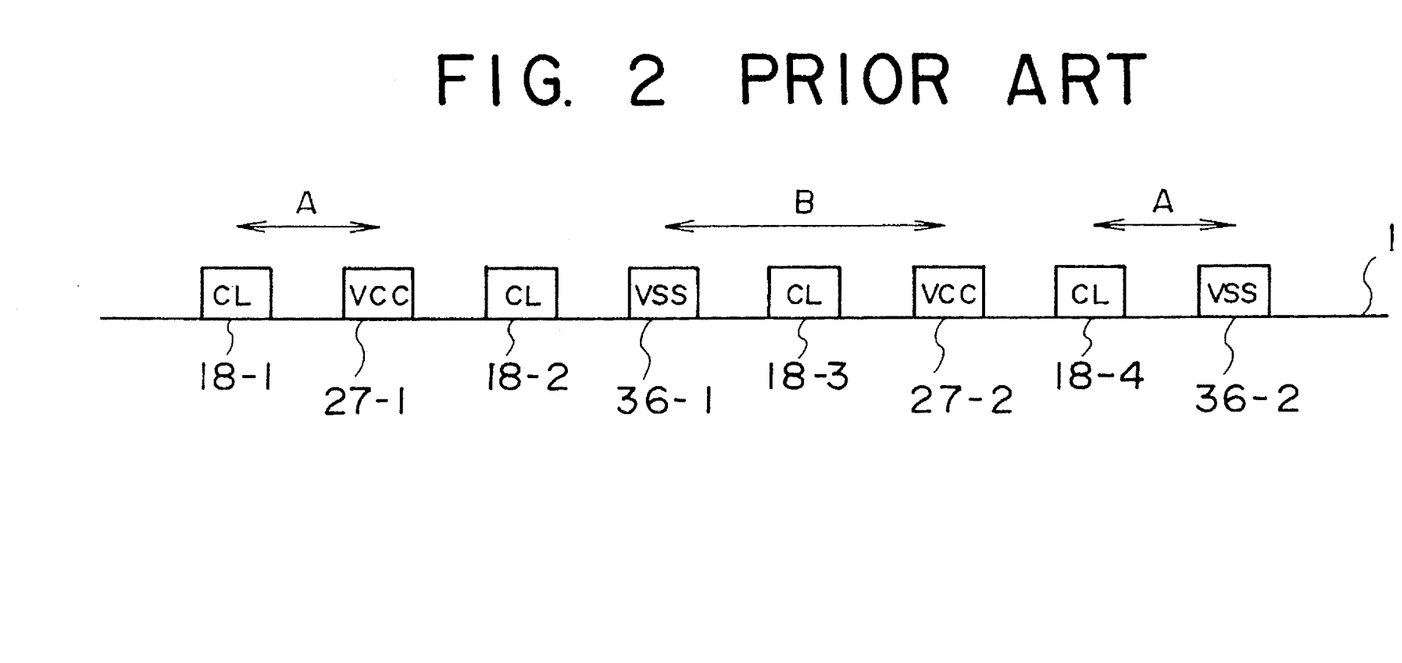
FIG. 2 is a diagram showing the arrangement of conductor patterns in the device of FIG. 1 in a cross sectional view taken along a line X—X of FIG. 1.

FIG. 2 shows a part of the drawing of FIG. 1 that includes the conductor patterns $18_{-1}$–$18_{-4}$, $27_{-1}$–$27_{-2}$ and $36_{-1}$–$36_{-2}$, in a cross sectional view taken along a line X—X' shown in FIG. 1.

Referring to FIG. 2, it will be noted that the conductor patterns $18_{-1}$–$18_{-4}$, $27_{-1}$ –$27_{-2}$ and $36_{-1}$–$36_{-2}$ extend parallel with each other in a column direction on the principal surface of the chip 1, wherein each of the conductor patterns $18_{-1}$–$18_{-4}$ is laterally bounded by a power conductor pattern that carries the Vcc voltage such as a pattern $27_{-1}$ at a first side and further by a power conductor pattern that carries the Vss voltage such as a pattern $36_{-1}$ at the other side.

In the semiconductor integrated circuit having such a construction, it will be noted that a dust particle having a size sufficient to cause a bridging across a pair of adjacent conductor patterns may easily cause a short circuit between the signal conductor pattern and the power conductor pattern. For example, a dust particle having a size A may cause a short circuit between the conductor patterns $18_{-1}$ and $27_{-1}$ or between the conductor patterns $18_{-4}$ and $36_{-2}$. Similarly, a dust particle having a size B may cause a short circuit between the conductor patterns $36_{-1}$ and $27_{-2}$ across the conductor pattern $18_{-3}$.

As long as the short circuit occurs between a power conductor pattern that carries the Vss voltage and a signal conductor pattern, no substantial problem occurs. It should be noted that the signal conductor pattern is in the Vss level at the time of stand-by operational mode, and no substantial current flows between the signal conductor pattern and the power conductor pattern having the Vss level.

On the other hand, when a short circuit occurs between the signal conductor pattern and the power conductor pattern that carries the Vcc voltage, a current is caused to flow from the power conductor pattern to the signal conductor pattern even at the time of stand-by mode, via the dust particle bridging thereacross. Further, when a dust particle having the size B causes a short circuit across the power conductor pattern that carries the Vss voltage and the power conductor pattern that carries the Vcc voltage, a current flows inevitably from the power conductor pattern at the Vcc level to the signal conductor pattern intervening between the two power conductor patterns at the time of the stand-by mode.

As the specification of DRAMs allows only a very small leak current in the stand-by mode, such a short circuit including the power conductor pattern of the Vcc voltage level generally renders the device as being defective, even when the short circuit is a minor one.

A short circuit between the power conductor pattern of the Vss level and the signal conductor pattern may also cause a problem in that the voltage level of the signal conductor pattern does not rise in the active operation mode, particularly in the case where the degree of short-circuit is substantial. In such a case, however, the defect may be saved by selecting a redundant memory cell column in place of the defective memory cell column in which the short circuit has occurred. In other words, the problem of short circuit of the signal conductor pattern may be saved by using the redundancy of the DRAM, as long as the short circuit occurs between the signal conductor pattern and the power conductor pattern of the Vss level.

On the contrary, the short circuit between the signal conductor pattern and the power conductor pattern of the Vcc level cannot be saved by the redundancy. It should be noted that the defective column maintains the selected state as a result of the short circuit, even when a redundant column is selected by way of the redundant construction. In such a case, a multiple accessing occurs in the DRAM in response to single address data. The same situation occurs also in the case where a power conductor pattern of the Vcc level and a power conductor patter of the Vss level are bridged by the dust particle having the size B. Hereinafter, the short circuit that causes a problem that cannot be saved by redundancy will be designated as "harmful short circuit."

SUMMARY OF THE INVENTION

Accordingly, it is a general object of the present invention to provide a novel and useful semiconductor memory device wherein the foregoing problems are eliminated.

Another and more specific object of the present invention is to provide a semiconductor device in which vulnerability to short circuit caused by dust particles, is substantially reduced.

Another object of the present invention is to provide a semiconductor device, comprising:

a plurality of signal lines;

a plurality of first power lines for supplying electric power at a first voltage level; and a plurality of second power lines for supplying electric power at a second voltage level;

said signal lines, said first power lines and said second power lines being disposed such that:

a signal line is laterally bounded by a first power line at a first side thereof and by another first power line at the other side thereof, and such that:

a signal line different from said signal line that is bounded laterally by said first power lines, is laterally bounded by a second power line at a first side thereof and by another second power line at the other side thereof.

Another object of the present invention is to provide a semiconductor memory device, comprising:

a memory cell array in which memory cells are arranged in rows and columns;

a plurality of sense amplifiers each corresponding to a column of said memory cells;

a plurality of first power lines each extending in a column direction for feeding electric power to a corresponding sense amplifier at a first voltage level;

a plurality of second power lines each extending in said column direction for feeding electric power to a corresponding sense amplifier at a second, different voltage level; and a plurality of control lines each extending in said column direction to a corresponding sense amplifier for carrying a control signal such that said control signal selects said sense amplifier;

said control lines, said first power lines and said second power lines being disposed such that:

a control line is laterally bounded by a first power line at a first side thereof and by another first power line at the other side thereof, and such that:

a control line different from said control line that is bounded laterally by said first power lines, is laterally bounded by a second power line at a first side thereof and by another second power line at the other side thereof.

According to the present invention, the chance that a dust particle causes a harmful short circuit between a signal line or control line and a first power line or a second power line is reduced as compared with the case in which a signal line or control line is laterally bounded by a first power line at a first side and further by a second power line at the other side.

In a preferred embodiment of the present invention, the signal line laterally bounded by the first power lines from both sides is repeated a plurality of times over a first region of a chip on which said semiconductor device is formed, and the signal line laterally bounded by the second power lines from both sides is repeated a plurality of times on a second region adjacent to said first region on said chip. By doing so, the chance of occurrence of harmful short circuit decreases further.

Other objects and further features of the present invention will become apparent from the following detailed description when read in conjunction with the attached drawings.

DETAILED DESCRIPTION OF THE PREFERRED EMBODIMENTS

Figure 3:
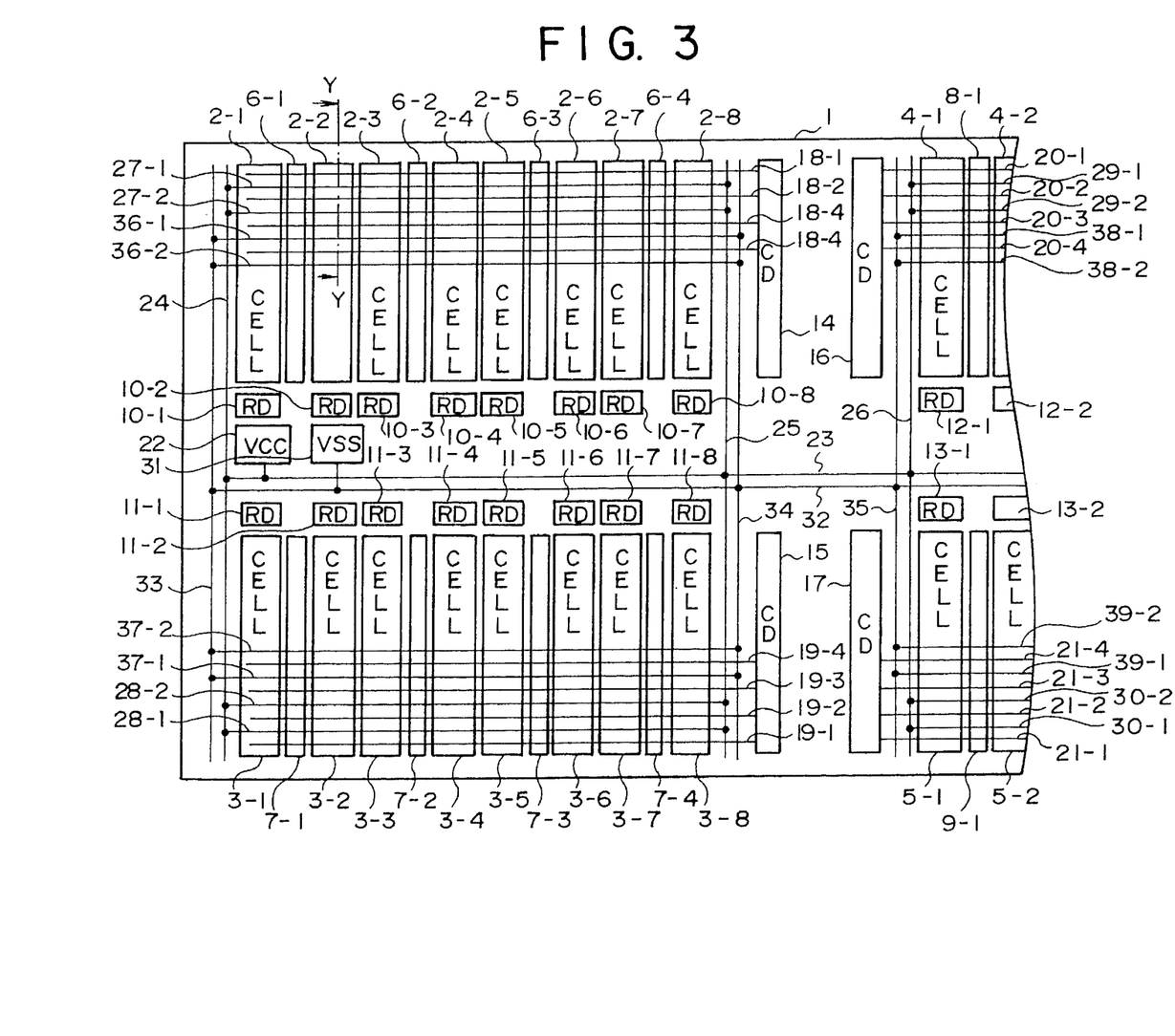
FIG. 3 is a diagram showing the layout of a DRAM according to a first embodiment of the present invention.
Figure 4:
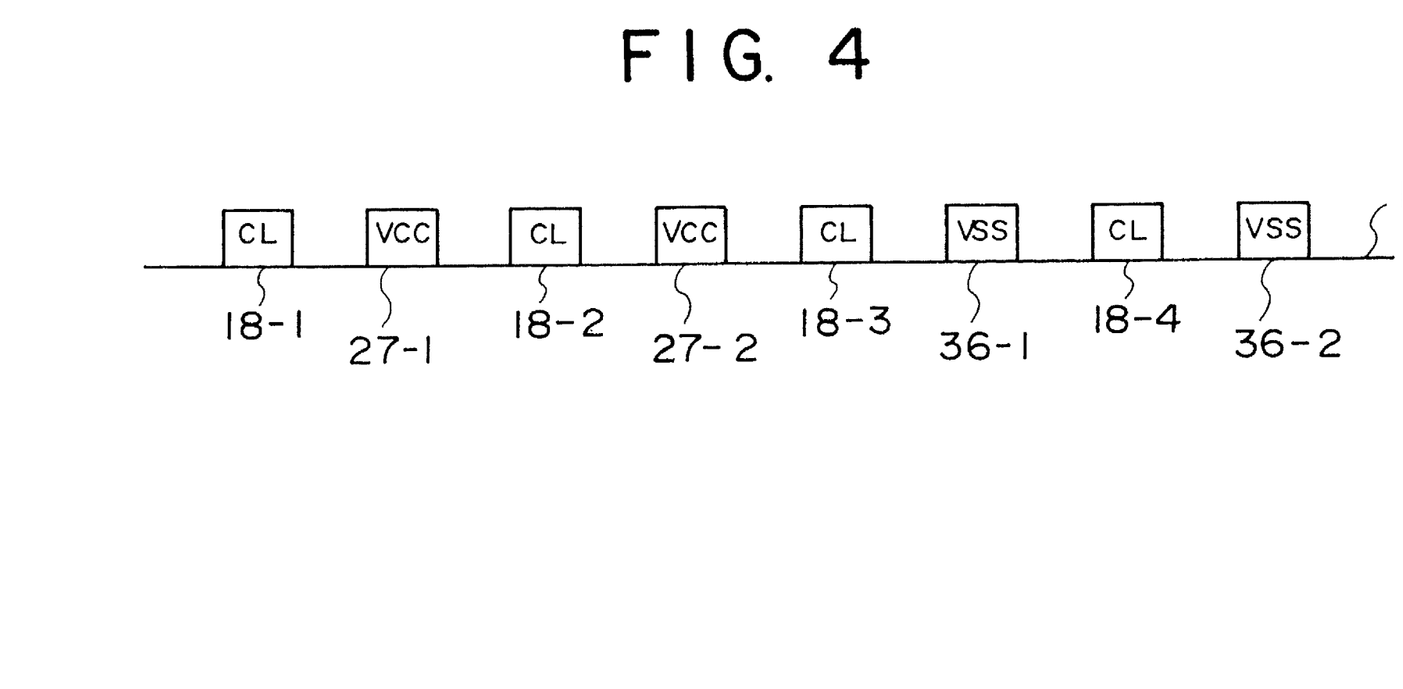
FIG. 4 is a diagram showing the arrangement of conductor patterns in the device of FIG. 3 in a cross sectional view taken along a line Y—Y of FIG. 3.

FIG. 3 shows the layout of a DRAM according to a first embodiment of the present invention, while FIG. 4 shows the arrangement of conductor patterns in the DRAM of FIG. 3 in a cross sectional view taken along a line Y—Y of FIG. 3. In the description hereinafter, those parts described already with reference to FIG. 1 are designated by the same reference numerals and the description thereof will be omitted.

Referring to FIGS. 3 and 4, it will be noted that the present embodiment disposes the power conductor patterns for feeding the Vcc voltage and the Vss voltage such that a signal conductor pattern is laterally bounded by a pair of power conductor patterns both carrying the same power voltage. For example, the signal conductor pattern $18_{-2}$ is laterally bounded by the power conductor pattern $27_{-1}$ at a first side and the power conductor pattern $27_{-2}$ at the other side, wherein both of the power conductor patterns $27_{-1}$ and $27_{-2}$ carry the same supply voltage of Vcc. Similarly, the signal conductor pattern $18_{-4}$ is laterally bounded by the power conductor patterns $36_{-1}$ and $36_{-2}$, wherein both of the power conductor patterns $36_{-1}$ and $36_{-2}$ carry the same supply voltage of Vss.

Figure 5A:
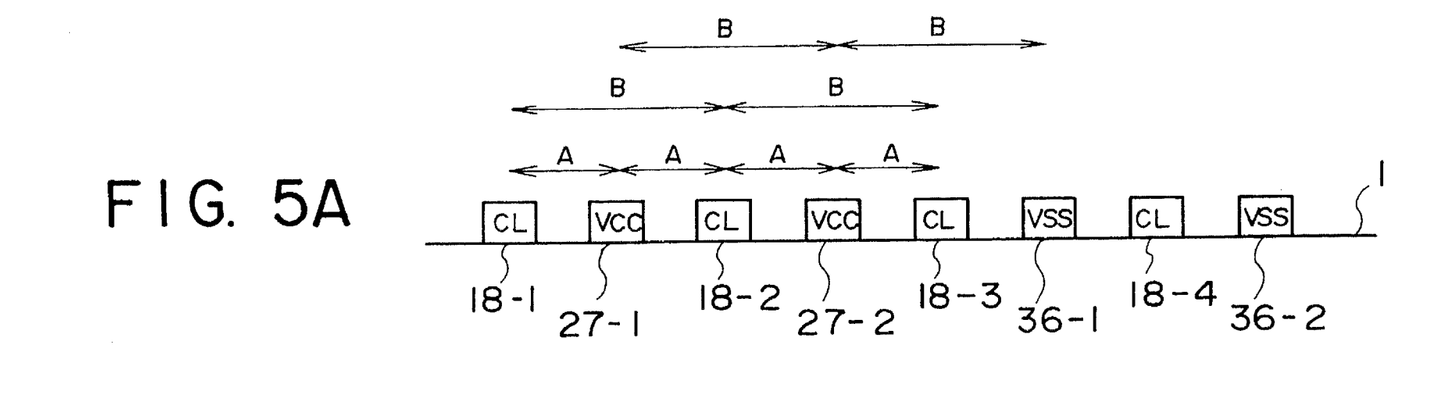
FIGS. 5A and 5B are diagrams showing the effect of the present invention for the DRAM of FIG. 3 in comparison with the conventional DRAM of FIG. 1.
Figure 5B:
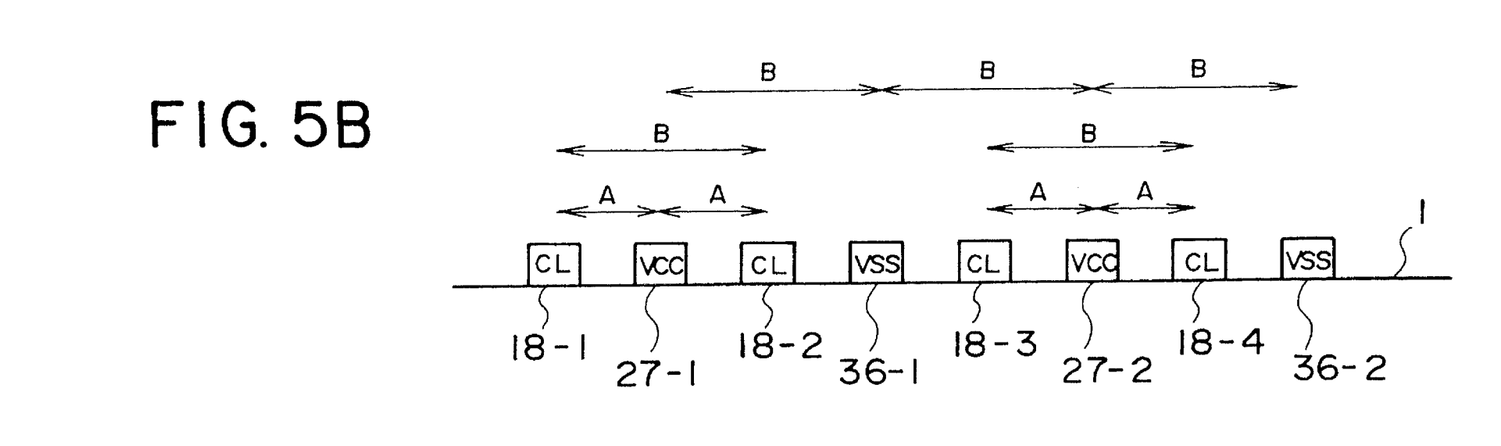

FIGS. 5A and 5B compare the occurrence of defects in the case of the DRAM of FIG. 3 and in the case of the conventional DRAM of FIG. 1, wherein FIG. 5A shows the case where dust particles having a size A or B have deposited upon the device.

Referring to FIG. 5A, it will be noted that there are four cases in which a dust particle having a size A causes a harmful short circuit in the DRAM of FIG. 3. More specifically, the dust particle of the size A may cause a harmful short circuit when it connects the signal conductor pattern $18_{-1}$ and the power conductor pattern $27_{-1}$, the power conductor pattern $27_{-1}$ and the signal conductor pattern $18_{-2}$, the signal conductor pattern $18_{-2}$ and the power conductor patter $27_{-2}$, and the power conductor pattern $27_{-2}$ and the signal conductor pattern $18_{-3}$.

Similarly, there are four cases in FIG. 5A in which the dust particle having a size B causes unwanted short circuit in the DRAM of FIG. 3. More specifically, the dust particle of the size B may cause a harmful short circuit when it bridges across the signal conductor patterns $18_{-1}$ and $18_{-2}$ over the power conductor pattern $27_{-1}$, the signal conductor patterns $18_{-2}$ and $18_{-3}$ over the power conductor pattern $27_{-2}$, the power conductor patterns $27_{-1}$ and $27_{-2}$ over the signal conductor pattern $18_{-2}$, and the power conductor patterns $27_{-2}$ and $36_{-1}$ over the signal conductor pattern $18_{-3}$.

In the case of the DRAM of FIG. 1, on the other hand, there are four cases in which harmful short circuit is caused by the dust particle having the size A and five cases in which harmful short circuit is caused by the dust particle of the size B as indicated in FIG. 5B. More specifically, the dust particle of the size A may cause a harmful short circuit when it connects the signal conductor pattern $18_{-1}$ and the power conductor pattern $27_{-1}$, the power conductor pattern $27_{-1}$ and the signal conductor pattern $18_{-2}$, the signal conductor pattern $18_{-3}$ and the power conductor patter $27_{-2}$, and the power conductor pattern $27_{-2}$ and the signal conductor pattern $18_{-4}$.

In the case of the dust particle of the size B, a harmful short circuit occurs when it bridges across the signal conductor patterns $18_{-1}$ and $18_{-2}$ over the power conductor pattern $27_{-1}$, the signal conductor patterns $18_{-3}$ and $18_{-4}$ over the power conductor pattern $27_{-2}$, the power conductor patterns $27_{-1}$ and $36_{-1}$ over the signal conductor pattern $18_{-2}$, the power conductor patterns $36_{-1}$ and $27_{-2}$ over the signal conductor pattern $18_{-3}$, and the power conductor patterns $27_{-2}$ and $36_{-2}$ over the signal conductor pattern $18_{-4}$.

Comparing the situations of FIG. 5A and FIG. 5B, it will be noted that the chance that a dust particle of the size B causes a harmful short circuit is larger by one in the conventional DRAM of FIG. 1 over the DRAM of FIG. 3. In other words, the DRAM of the present embodiment is less vulnerable to the short circuit caused by dust particles.

Figure 6:
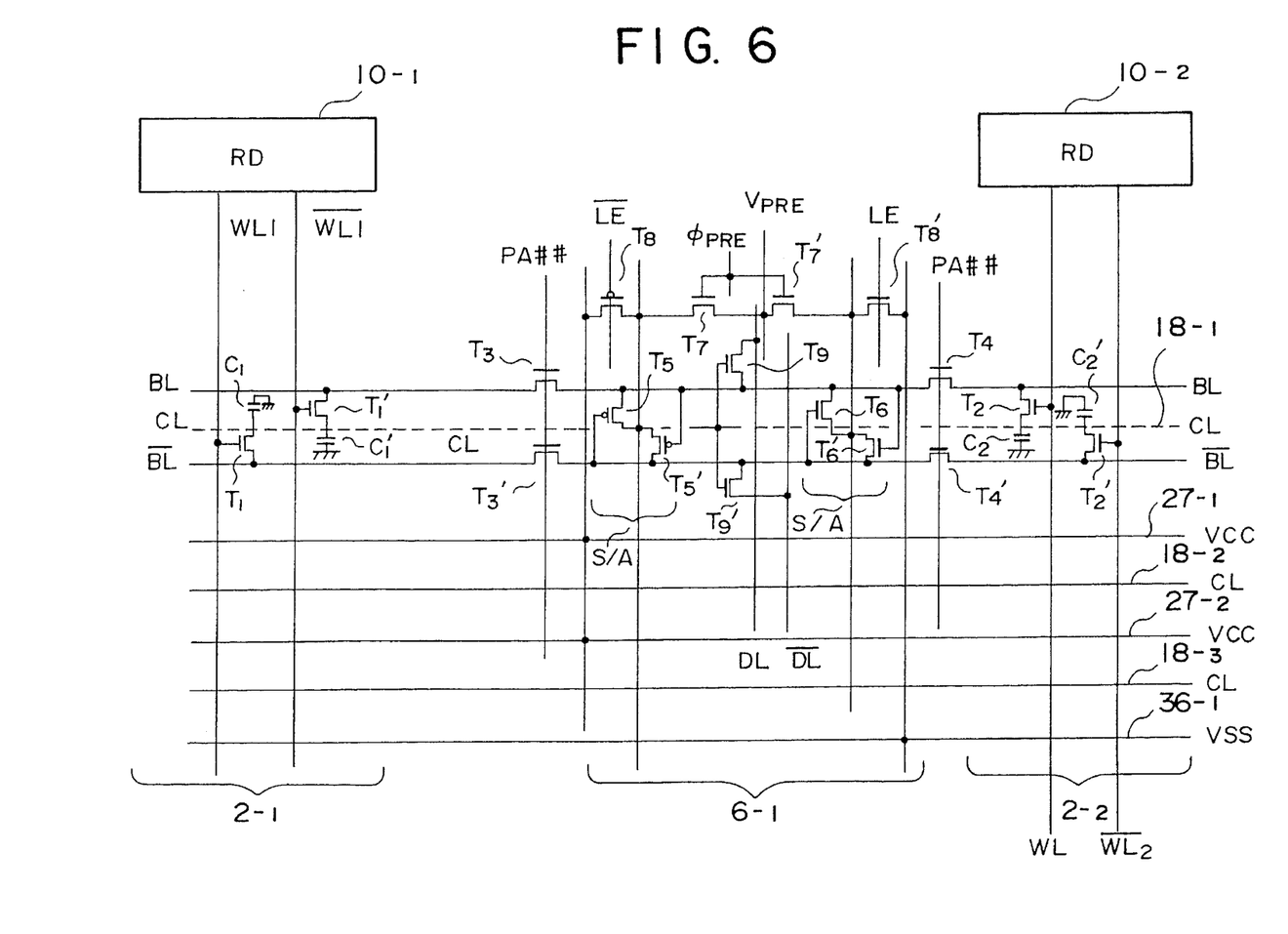
FIG. 6 is a circuit diagram showing a part of FIG. 3 in detail.
Figure 7:
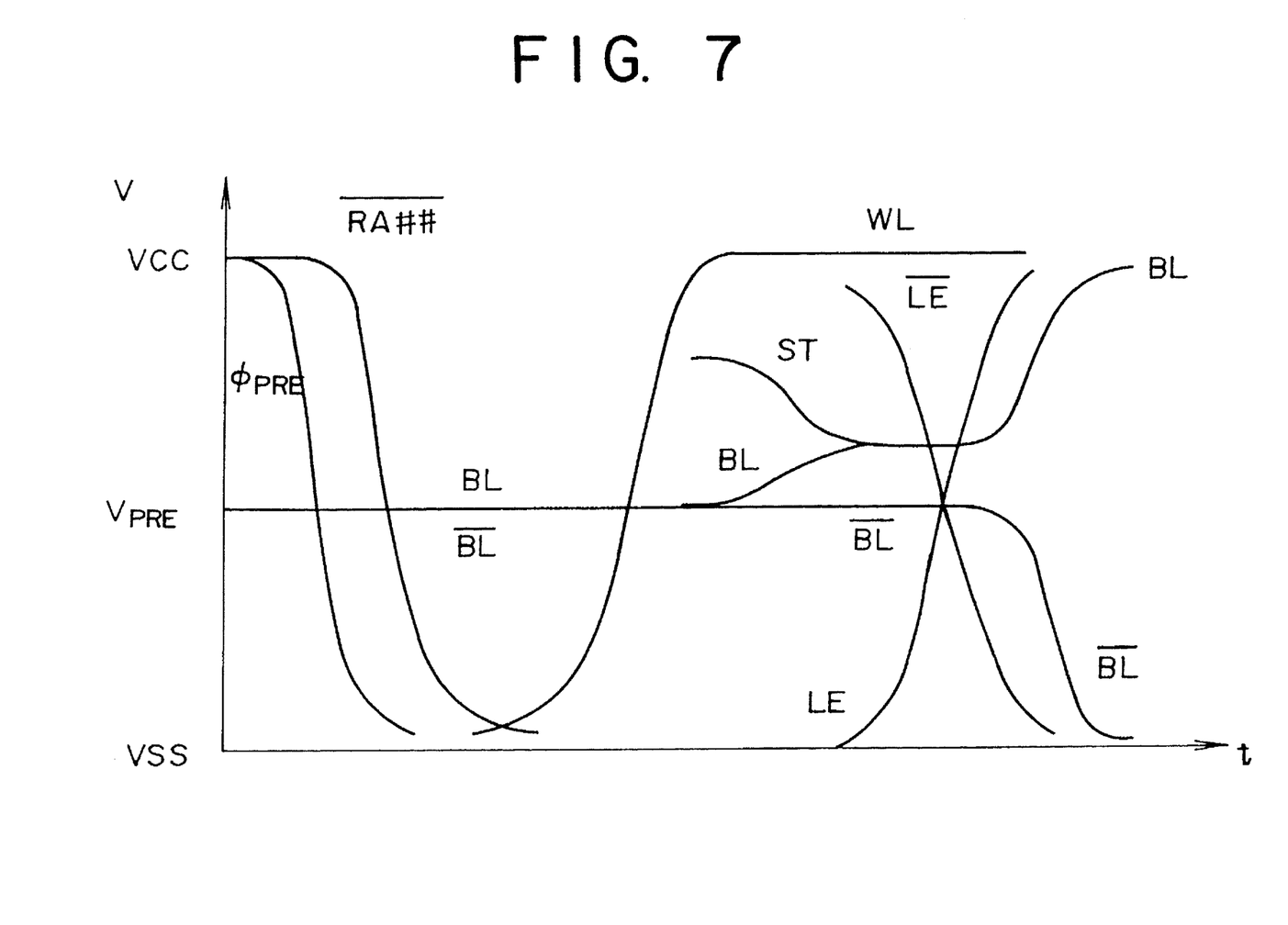
FIG. 7 is a diagram showing the operation of the DRAM of FIG. 6.

FIG. 6 shows a detailed construction of the DRAM of FIG. 3, while FIG. 7 shows the operation of the same. In FIG. 6, those parts described previously are designated by the same reference numerals and the description thereof will be omitted.

Referring to FIG. 6 showing a part of the memory cell blocks $2_{-1}$ and $2_{-2}$ as well as a part of the sense amplifier block $6_{-1}$, it will be noted that the memory cell block $2_{-1}$ includes an array of memory cells formed of memory cell transistors $T_1$ and $T_1'$ as well as capacitors $C_1$ and $C_1'$ cooperating therewith. The capacitor $C_1'$ is connected to a bit line BL via the transistor $T_1'$ while the capacitor $C_1$ is connected to a complementary bit line $\overline{BL}$ via the transistor $T_1$, wherein the bit lines BL and $\overline{BL}$ extend parallel with each other in the column direction from the column decoder 14 not shown in FIG. 6. Further, the transistors $T_1$ and $T_1'$ are connected to respective word lines $WL_1$ or $\overline{WL_1}$ that extend parallel with each other in the row direction from the row decoder $10_{-1}$.

Similarly, the memory cell block $2_{-2}$ includes an array of memory cells formed of memory cell transistors $T_2$ and $T_2'$ as well as capacitors $C_2$ and $C_2'$ cooperating therewith. Thereby, the capacitor $C_2$ is connected to the bit line BL via the transistor $T_2$ while the capacitor $C_2'$ is connected to the foregoing complementary bit line $\overline{BL}$ via the transistor $T_2'$. Further, each of the transistors $T_2$ and $T_2'$ is connected to respective word lines $WL_2$ and $\overline{WL_2}$ that extend parallel with each other in the row direction from the row decoder $10_{-2}$.

The sense amplifier block $6_{-1}$, on the other hand is laterally bounded by N-channel MOS transistors $T_3$ and $T_3'$ at a first side as well as by N-channel MOS transistors $T_4$ and $T_4'$ at a second, opposite side, wherein the transistors $T_3$ and $T_4$ are inserted to the bit line BL so as to connect and disconnect the sense amplifier block $6_{-1}$ to and from the bit line BL in response to a control signal PA## supplied to respective gates thereof. Similarly, the transistors $T_3'$ and $T_4'$ are inserted to the bit line $\overline{BL}$ so as to connect and disconnect the sense amplifier block $6_{-1}$ to and from the bit line $\overline{BL}$ in response to the control signal PA## that is supplied also to respective gates of the transistors $T_3'$ and $T_4'$.

In the sense amplifier block $6_{-1}$, it will be noted that P-channel MOS transistors $T_5$ and $T_5'$ are connected in series across the bit lines BL and $\overline{BL}$ and form a part of a sense amplifier S/A. Similarly, N-channel MOS transistors $T_6$ and $T_6'$ are connected in series across the bit lines BL and $\overline{BL}$ as a part of the sense amplifier S/A. The gates of the transistors $T_5$ and $T_6$ are connected to the bit line $\overline{BL}$ while the gates of the transistors $T_5'$ and $T_6'$ are connected to the bit line BL. As a result, the transistors T5, T5', T6 and T6' are cross coupled to form a flip-flop circuit that characterizes a sense amplifier.

In the construction of FIG. 6, the supply voltage of Vcc level is fed to the sense amplifier S/A at the node where the transistors $T_5$ and $T_5'$ are connected via a p-channel transistor $T_8$ that forms a part of the driver circuit of the sense amplifier S/A. Similarly, the supply voltage of Vss level is fed to the sense amplifier S/A at the node where the transistors $T_6$ and $T_6'$ are connected via a N-channel MOS transistor T8', wherein the transistor T8' also forms a part of the driver circuit of the sense amplifier S/A. It will be noted that the transistor $T_8$ is supplied with a control signal $\overline{LE}$ at the gate thereof and supplies the Vcc voltage on the power conductor $27_{-1}$ to the foregoing node where the transistors $T_5$ and $T_5'$ are connected. Similarly, the transistor $T_8'$ is supplied with a control signal LE at the gate thereof and supplies the Vss voltage on the power conductor $36_{-1}$ to the node where the transistors $T_6$ and $T_8'$ are connected.

Further, the node where the transistors $T_5$ and $T_5'$ are connected is supplied with a precharge voltage $V_{PRE}$ set to a level approximately equal to Vcc/2 via a transistor $T_7$, wherein the same precharge voltage $V_{PRE}$ is supplied to the node where the transistors $T_6$ and $T_6'$ are connected via a transistor $T_7'$. Thereby, transistors $T_7$ and $T_7'$ supply the foregoing precharge voltage $V_{PRE}$ in response to a control signal $\phi_{PRE}$ and hold the level of the bit lines BL and $\overline{BL}$ at the precharge level $V_{PRE}$ in the inactivated mode of the DRAM. Further, reading of data is made from the bit lines BL and $\overline{BL}$ on data lines DL and $\overline{DL}$ via transistors $T_9$ and $T_9'$.

FIG. 7 shows the reading of data from the DRAM of FIG. 6 and hence FIG. 3.

Referring to FIG. 7, the control signal $\phi_{PRE}$ goes low, followed by the control signal $\overline{RA\#\#}$. In this state, the bit lines BL and $\overline{BL}$ holds the initial, precharge level $V_{PRE}$. After the transition of the signals $\phi_{PRE}$ and $\overline{RA\#\#}$ as such, the word line voltage WL goes high on the selected word line, and the electric charges ST in the memory cells thus selected are transferred to the bit line BL. In response to this, the level of the bit BL is pulled up slightly.

After the word line voltage WL has caused transition as such, the sense amplifier S/A is activated as indicated by control signals LE and $\overline{LE}$ and the level of the bit line BL is fully pulled up. Simultaneously, the level of the bit line $\overline{BL}$ is fully pulled down as a result of flip-flop operation of the sense amplifier S/A. The voltage thus appearing across the bit lines BL and $\overline{BL}$ is read out by the transistors $T_9$ and $T_9'$ on the data lines DL and $\overline{DL}$ as already noted.

Figure 8:
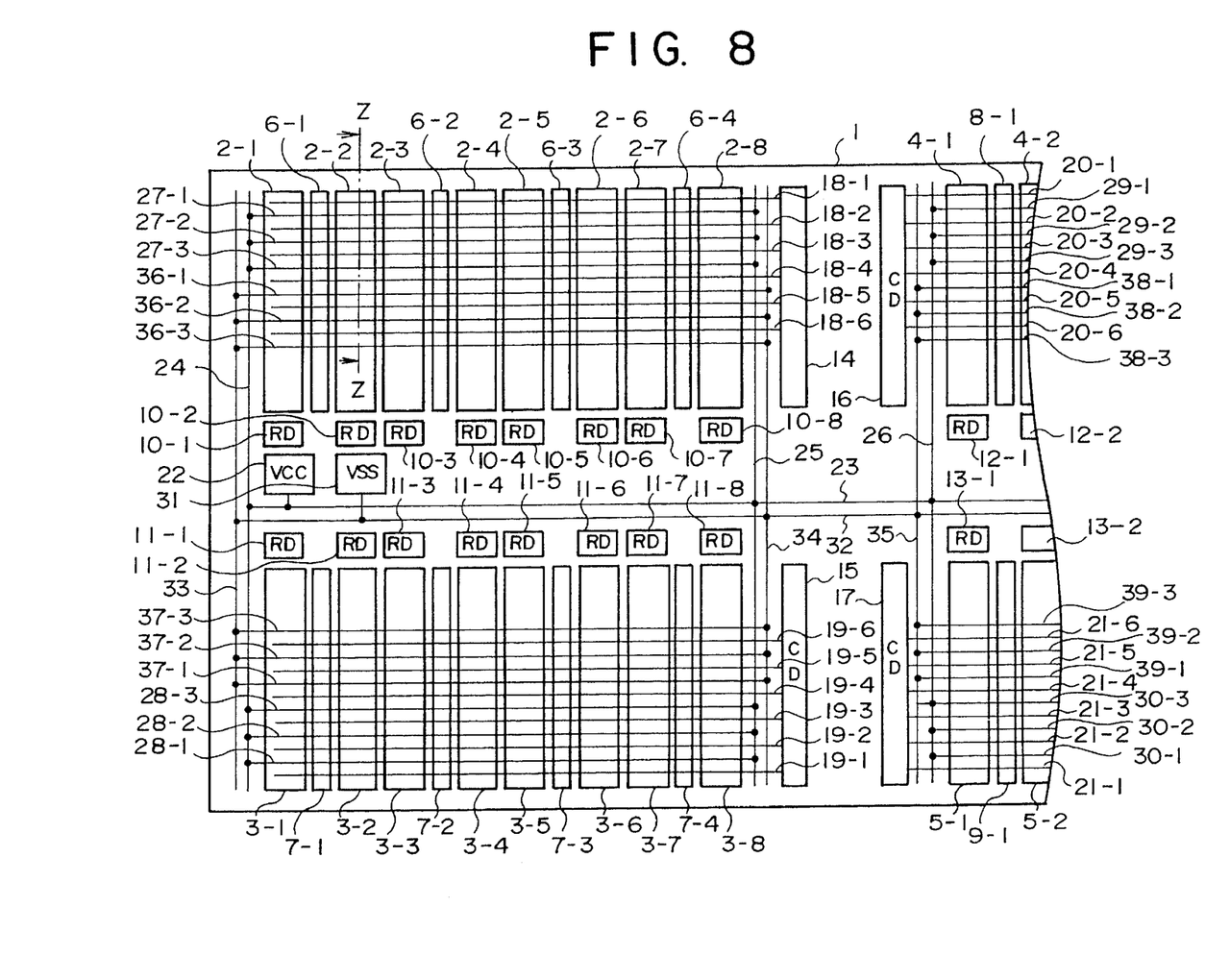
FIG. 8 is a diagram showing the layout of a DRAM according to a second embodiment of the present invention.
Figure 9:
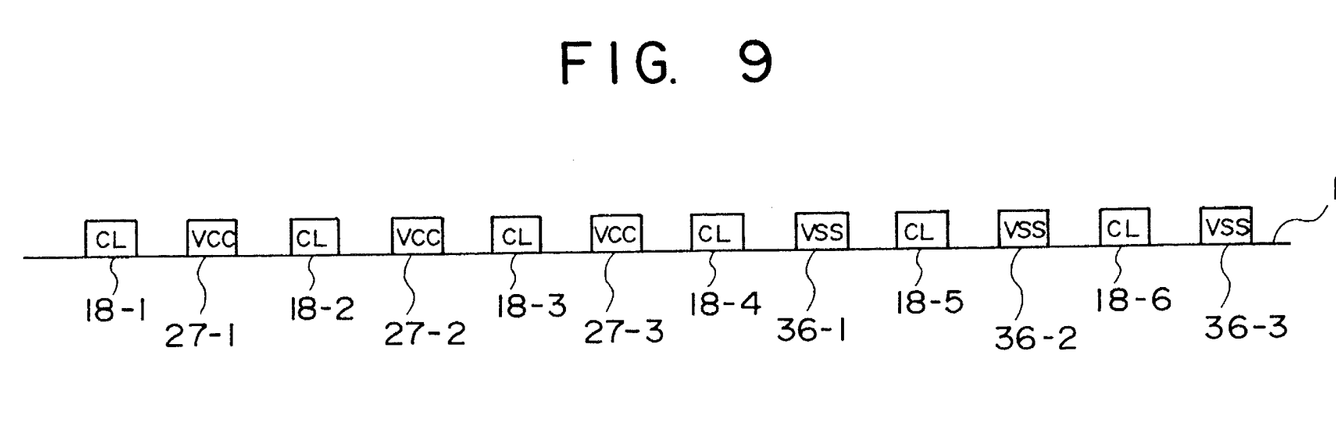
FIG. 9 is a diagram showing the arrangement of conductor patterns in the device of FIG. 8 in a cross sectional view taken along a line Z—Z of FIG. 8.

FIG. 8 shows the layout of a DRAM according to a second embodiment of the present invention while FIG. 9 shows a part of the device of FIG. 8 in a cross sectional view taken along a line Z—Z of FIG. 8.

Referring to FIGS. 8 and 9, it will be noted that the power conductor patterns $27_{-1}$, $27_{-2}$ and $27_{-3}$ for the Vcc voltage are assembled in a first area and the power conductor patterns $36_{-1}$, $36_{-2}$ and $36_{-3}$ are assembled in a second area of the device, such that in the first area, the signal conductor patterns $18_{-1}$, $18_{-2}$ and $18_{-3}$ are disposed alternately with the power conductor patterns $27_{-1}$, $27_{-2}$ and $27_3$. Similarly, in the second area, the signal conductor patterns $18_{-4}$, $18_{-5}$ and $18_{-6}$ are disposed alternately with the power conductor patterns $36_{-1}$, $36_{-2}$ and $36_3$. In such a construction, only one signal conductor pattern, that is the signal conductor pattern $18_{-4}$, is laterally bounded by a power conductor pattern for the Vcc voltage at a first side and by a power conductor pattern for the Vss voltage at the other side.

Figure 10A:
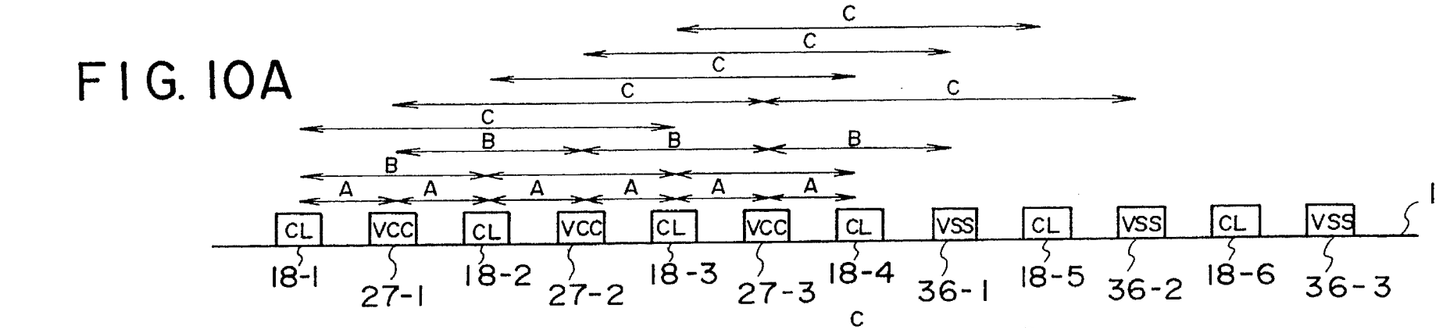
FIGS. 10A and 10B are diagrams showing the effect of the present invention for the DRAM of FIG. 8 in comparison with the conventional DRAM of FIG. 1.
Figure 10B:
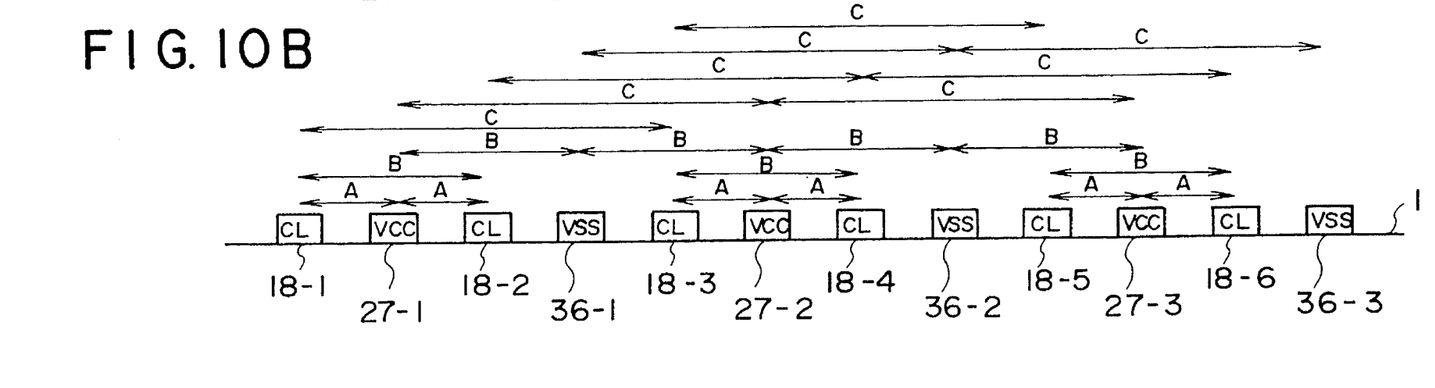

FIGS. 10A and 10B compare the chance that harmful short circuit occurs in the DRAM of FIG. 8 in comparison with the DRAM of FIG. 1.

Referring to FIG. 10A showing the case of the device of FIG. 8, it will be noted that there are six possibilities in which a harmful short circuit is caused by the dust particle having the size A corresponding to the separation between adjacent conductor patterns. More specifically, such a harmful short circuit may occur when the dust particle of the size A connects the conductor patterns $18_{-1}$ and $27_{-1}$, $27_{-1}$ and $18_{-2}$, $18_{-2}$ and $27_{-2}$, $27_{-2}$ and $18_{-3}$, $18_{-3}$ and $27_{-3}$, or $27_{-3}$ and $18_{-4}$.

Similarly, there are six possibilities in which harmful short circuit is caused by the dust particles having the size B that extends for a distance covering three successive conductor patterns. More specifically, such a harmful short circuit may occur when the dust particle of the size B bridges across the conductor patterns $18_{-1}$ and $18_{-2}$ over the conductor pattern $27_{-1}$, the conductor patterns $18_{-2}$ and $18_{-3}$ over the conductor pattern $27_{-2}$, the conductor patterns $18_{-3}$ and $18_{-4}$ over the conductor pattern $27_{-3}$, the conductor patterns $27_{-1}$ and $27_{-2}$ over the conductor pattern $18_{-2}$, the conductor patterns $27_{-2}$ and $27_{-3}$ over the conductor pattern $18_{-3}$, or the conductor patterns $27_{-3}$ and $36_{-1}$ over the conductor pattern $18_{-4}$.

Further, there are six possibilities in which harmful short circuit is caused by the dust particle having a size C that extends for a distance covering four successive conductor patterns. More specifically, such a harmful short circuit may occur when the dust particle of the size C bridges across the conductor patterns $18_{-1}$ through $18_{-3}$ over the conductor patterns $27_{-1}$, $18_{-2}$ and $27_{-2}$, the conductor patterns $27_{-1}$ through $27_{-3}$ over the conductor patterns $18_{-2}$, $27_{-2}$ and $18_{-3}$, the conductor patterns $27_{-3}$ through $36_{-2}$ over the conductor patterns $18_{-4}$, $36_{-1}$ and $18_{-5}$, the conductor patterns $18_{-2}$ through $18_{-4}$ over the conductor patterns $27_{-2}$, $18_{-3}$ and $27_{-3}$, the conductor patterns $27_{-2}$ through $36_{-1}$ over the conductor patterns $18_{-3}$, $27_{-3}$ and $18_{-4}$, or the conductor patterns $18_{-3}$ through $18_{-5}$ over the conductor patterns $27_{-3}$, $18_{-4}$ and $36_{-1}$.

In the case of the conventional device of FIG. 1, on the other hand, there are also six possibilities in which a harmful short circuit is caused by the dust particle having the size A, wherein such a harmful short circuit occurs when the dust particle connects the conductor patterns $18_{-1}$ and $27_{-1}$, $27_{-1}$ and $18_{-2}$, $18_{-3}$ and $27_{-2}$, $27_{-2}$ and $18_{-4}$, $18_{-5}$ and $27_{-3}$, or $27_{-3}$ and $18_{-6}$.

Further, there are seven possibilities in which harmful short circuit is caused by the dust particles having the size B in the case of the device of FIG. 1, wherein such a harmful short circuit occurs when the dust particle bridges across the conductor patterns $18_{-1}$ and $18_{-2}$ over the conductor pattern $27_{-1}$, the conductor patterns $18_{-3}$ and $18_{-4}$ over the conductor pattern $27_{-2}$, the conductor patterns $18_{-5}$ and $18_{-6}$ over the conductor pattern $27_{-3}$, the conductor patterns $27_{-1}$ and $36_{-1}$ over the conductor pattern $18_{-2}$, the conductor patterns $36_{-1}$ and $27_{-2}$ over the conductor pattern $18_{-3}$, the conductor patterns $27_{-2}$ and $36_{-2}$ over the conductor pattern $18_{-4}$, or the conductor patterns $36_{-2}$ and $27_{-3}$ over the conductor pattern $18_{-5}$.

Further, there are eight possibilities in which harmful short circuit is caused by the dust particle having the size C in the device of FIG. 1, wherein such a harmful short circuit may occur when the dust particle of the size C bridges across the conductor patterns $18_{-1}$ through $18_{-3}$ over the conductor patterns $27_{-1}$, $18_{-2}$ and $36_{-1}$, the conductor patterns $27_{-1}$ through $18_{-3}$ over the conductor patterns $18_{-2}$, $36_{-1}$ and $18_{-3}$, the conductor patterns $27_{-2}$ through $27_{-3}$ over the conductor patterns $18_{-4}$, $36_{-2}$ and $18_{-5}$, the conductor patterns $18_{-2}$ through $18_{-4}$ over the conductor patterns $36_{-1}$, $18_{-3}$ and $27_{-2}$, the conductor patterns $18_{-4}$ through $27_{-3}$ over the conductor patterns $36_{-2}$, $18_{-5}$ and $27_{-3}$, the conductor patterns $36_{-1}$ through $36_{-2}$ over the conductor patterns $18_{-3}$, $27_{-2}$ and $18_{-4}$, the conductor patterns $36_2$–$36_{-3}$ over the conductor patterns $18_{-5}$, $27_{-3}$ and $18_{-6}$, or the conductor patterns $18_{-3}$ through $18_{-5}$ over the conductor patterns $27_{-3}$, $18_{-4}$ and $36_{-1}$.

Comparing the result of FIG. 10A with the result of FIG. 10B, it will be noted that the chance that the dust particles cause a harmful short circuit in the DRAM is reduced substantially in the DRAM of FIG. 8 as compared with the conventional device of FIG. 1.

Figure 11:
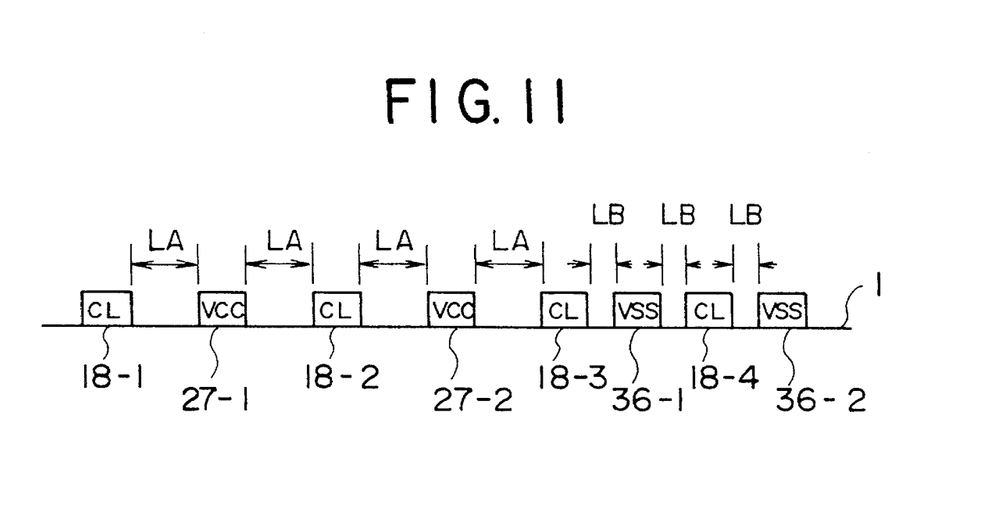
FIG. 11 is a diagram showing the arrangement of conductor patterns in a DRAM according to a third embodiment of the present invention.

FIG. 11 shows the construction of a DRAM according to a third embodiment of the present invention. As the plan view of the device is substantially identical with that of the device of FIG. 3 or FIG. 8, only the cross sectional view is represented.

Referring to FIG. 11, it will be noted that the power conductor patterns $27_{-1}$ and $27_{-2}$ that carry the supply voltage of Vcc level are formed with a separation LA from an adjacent signal conductor pattern such as the pattern $18_{-1}$, $18_{-2}$ or $18_{-3}$, wherein the separation LA is substantially increased as compared with a separation LB between the power conductor pattern carrying the Vss voltage such as the pattern $36_{-1}$ or $36_{-2}$ and the signal conductor pattern such as the pattern $18_{-3}$ or $18_{-4}$. Thereby, the chance that the harmful short circuit occurs between the power conductor pattern of the Vcc level and the adjacent signal conductor pattern is substantially reduced. As explained already, the short circuit between the power conductor pattern of the Vss level and the signal conductor pattern can be saved by the redundant circuitry of the device and raises no serious problem. It is the short circuit occurring between the power conductor pattern of the Vcc level and the signal conductor pattern that causes a failure in which the redundancy of the device is ineffective and hence is harmful.

Figure 12:
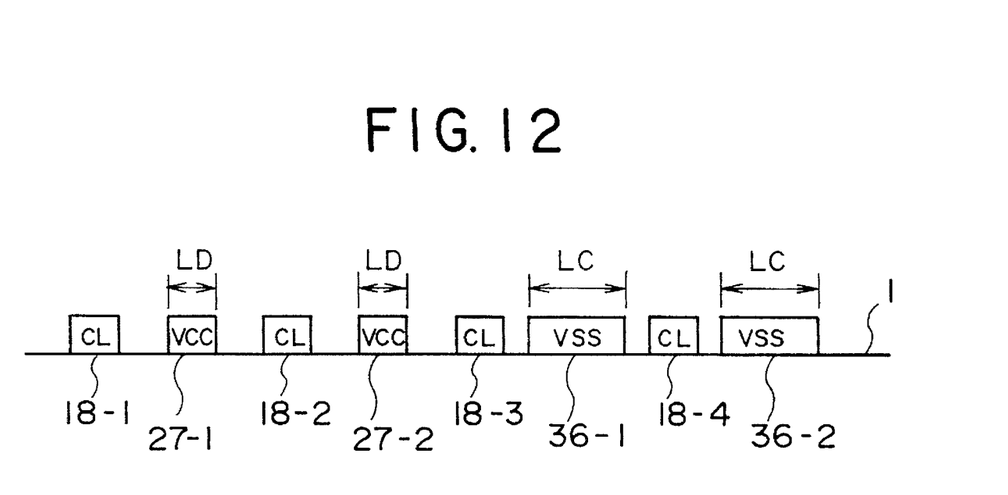
FIG. 12 is a diagram showing the arrangement of conductor patterns in a DRAM according to a fourth embodiment of the present invention.

FIG. 12 shows a fourth embodiment of the present invention. Similarly to the third embodiment, only the cross sectional view of the device will be presented.

Referring to FIG. 12, the present embodiment reduces the width LD of the power conductor patterns for the Vcc voltage such as the conductor patterns $27_{-1}$ and $27_{-2}$ with respect to the width LC of the power conductor patterns $36_{-1}$ and $36_{-2}$, such that the chance that a dust particle falls upon the power conductor patterns of the Vcc level is reduced.

Further, the construction of the present invention is not limited to DRAMs but is applicable also to other semiconductor memory devices such as SRAMs or any other semiconductor devices in which signal conductor patterns and power conductor patterns extend parallel with each other.

Further, the present invention is not limited to the embodiments described heretofore, but various variations and modifications may be made without departing from the scope of the invention.

What is claimed is:

1. A semiconductor device, comprising:

a plurality of signal lines;

a plurality of first power lines for supplying electric power at a first voltage level; and a plurality of second power lines for supplying electric power at a second voltage level;

said signal lines, said first power lines and said second power lines extending parallel and being disposed such that:

a signal line is laterally bounded by a first power line at a first side thereof and by another first power line at the other side thereof, and such that:

a signal line different from said signal line that is bounded laterally by said first power lines, is laterally bounded by a second power line at a first side thereof and by another second power line at the other side thereof.

2. A semiconductor device as claimed in claim 1, wherein said semiconductor device includes a first region defined on a semiconductor chip such that said signal lines and said first power lines are disposed alternately a plurality of times in said first region, and wherein said semiconductor chip is further defined with a second, different region in which said signal lines and said second power lines are disposed alternately a plurality of times.

3. A semiconductor device as claimed in claim 1, wherein said first power lines and said signal lines bounded laterally by said first power lines are disposed with a first mutual separation, said second power lines and said signal lines bounded laterally by said second power lines are disposed with a second mutual separation, and wherein said first distance is larger than said second distance.

4. A semiconductor device as claimed in claim 1, wherein each of said first power lines has a first width, each of said second power lines has a second width, wherein said first width is substantially smaller than said second width.

5. A semiconductor memory device, comprising:

a memory cell array in which memory cells are arranged in rows and columns;

a plurality of sense amplifiers each corresponding to a column of said memory cells;

a plurality of first power lines each extending in a column direction for feeding electric power to a corresponding sense amplifier at a first voltage level;

a plurality of second power lines each extending in said column direction for feeding electric power to a corresponding sense amplifier at a second, different voltage level; and a plurality of control lines each extending in said column direction to a corresponding sense amplifier for carrying a control signal such that said control signal selects said sense amplifier;

said control lines, said first power lines and said second power lines being disposed such that:

a control line is laterally bounded by a first power line at a first side thereof and by another first power line at the other side thereof, and such that:

a control line different from said control line that is bounded laterally by said first power lines, is laterally bounded by a second power line at a first side thereof and by another second power line at the other side thereof.

6. A semiconductor memory device as claimed in claim 5, wherein said semiconductor memory device includes a first region defined on a semiconductor chip such that said control lines and said first power lines are disposed alternately a plurality of times in said first region, and wherein said semiconductor chip is further defined with a second, different region in which said control lines and said second power lines are disposed alternately a plurality of times.

7. A semiconductor device as claimed in claim 5, wherein said first power lines and said control lines bounded laterally by said first power lines are disposed with a first mutual separation, said second power lines and said control lines bounded laterally by said second power lines are disposed with a second mutual separation, and wherein said first distance is larger than said second distance.

8. A semiconductor device as claimed in claim 5, wherein each of said first power lines has a first width, each of said second power lines has a second width, wherein said first width is substantially smaller than said second width.

* * * * *